United States Patent
Kim

(10) Patent No.: US 9,990,978 B2
(45) Date of Patent: Jun. 5, 2018

(54) SEMICONDUCTOR DEVICES RELATING TO A REFRESHING OPERATION

(71) Applicant: SK hynix Inc., Icheon-si Gyeonggi-do (KR)

(72) Inventor: Bo Yeun Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days. days.

(21) Appl. No.: 15/248,361

(22) Filed: Aug. 26, 2016

(65) Prior Publication Data
US 2017/0270997 A1    Sep. 21, 2017

(30) Foreign Application Priority Data
Mar. 17, 2016 (KR) .................. 10-2016-0032404

(51) Int. Cl.
*G11C 7/10* (2006.01)
*G11C 11/406* (2006.01)
*G11C 11/408* (2006.01)

(52) U.S. Cl.
CPC .... *G11C 11/40618* (2013.01); *G11C 11/4082* (2013.01)

(58) Field of Classification Search
CPC ............. G11C 11/406; G11C 11/40611; G11C 11/40618; G11C 11/40615; G11C 11/40622; G11C 2211/4065
USPC .................................................. 365/189.05
See application file for complete search history.

(56) References Cited

U.S. PATENT DOCUMENTS

| 8,233,348 | B2* | 7/2012 | Lee ...................... G11C 11/4087 365/230.03 |
| 8,315,118 | B2* | 11/2012 | Chu ......................... G11C 7/12 365/203 |
| 8,953,403 | B1* | 2/2015 | Song ................ G11C 11/40618 365/222 |
| 9,202,549 | B2* | 12/2015 | Lee ....................... G11C 11/406 |
| 9,336,851 | B2* | 5/2016 | Yu ...................... G11C 11/40603 |
| 2016/0019944 | A1* | 1/2016 | Jung ..................... G11C 29/76 365/200 |
| 2016/0055896 | A1* | 2/2016 | Lim ...................... G11C 11/408 365/149 |
| 2017/0140811 | A1* | 5/2017 | Joo .................... G11C 11/40618 |

FOREIGN PATENT DOCUMENTS

KR    1020060080331 A    7/2006

* cited by examiner

*Primary Examiner* — Fernando Hidalgo
*Assistant Examiner* — Roberto Mancera, Jr.
(74) *Attorney, Agent, or Firm* — William Park & Associates Ltd.

(57) ABSTRACT

A semiconductor device may be provided. The semiconductor device may include an address input circuit and a target address generation circuit. The address input circuit may be configured to latch a bank address and an address to generate a bank active signal and a latch address based on the execution of an active operation. The target address generation circuit may be configured to generate the latch address as a target address.

11 Claims, 10 Drawing Sheets

SEMICONDUCTOR DEVICES RELATING TO A REFRESHING OPERATION

CROSS-REFERENCE TO RELATED APPLICATIONS

The present application claims priority under 35 U.S.C 119(a) to Korean Patent Application No. 10-2016-0032404, filed on Mar. 17, 2016, which is herein incorporated by references in its entirety.

BACKGROUND

1. Technical Field

Embodiments of the present disclosure may generally relate to semiconductor devices, and more particularly, semiconductor device(s) relating to a refresh operation.

2. Related Art

Each semiconductor device, such as dynamic random access memory (DRAM) devices, may include a plurality of memory cells for storing data. Each DRAM cell of the DRAM devices may be configured to include a cell capacitor and a cell transistor. The DRAM devices may store data therein by discharging or charging the cell capacitors. Once the cell capacitor is charged or discharged to store a datum therein, an amount of electric charge stored in the cell capacitor has to be ideally constant even though time elapses. However, the amount of electric charges stored in the cell capacitor may actually vary because of a voltage difference between the cell capacitor and a circuit adjacent to the cell capacitor or because of a leakage current of the cell capacitor. In particular, if the amount of electric charges stored in the cell capacitor is reduced, the cell capacitor may lose a datum stored therein. This can cause malfunction of the DRAM device. Thus, the DRAM devices may require a refresh operation to prevent the memory cells from losing their data.

As semiconductor devices become more highly integrated with the development of process technologies, a distance between the memory cells as well as a distance between word lines connected to the memory cells is continuously reduced. If a distance between the word lines is reduced, data stored in the adjacent memory cells may be changed due to a coupling phenomenon or an interference phenomenon between the word lines.

Recently, an addition refresh scheme has been applied to a word line adjacent to a target word line, which is frequently accessed or activated, in order to prevent the memory cells connected to the word line adjacent to the target word line from losing their data due to the interference phenomenon between the word lines. The addition refresh scheme applied to the word line adjacent to the activated target word line is referred to as smart refresh.

SUMMARY

According to an embodiment, a semiconductor device includes an address input circuit and a target address generation circuit. The address input circuit latches a bank address and an address to generate a bank active signal and a latch address based on the execution of an active operation. The target address generation circuit outputs the latch address as a target address whenever a refresh command of a bank activated by the bank active signal is enabled. In addition, the target address generation circuit stores the target address within the target address generation circuit.

According to another embodiment, a semiconductor device includes a target address output circuit and an address shift circuit. The target address output circuit outputs a latch address as a target address based on a bank active signal and a stop signal. The address shift circuit sequentially shifts and latches the target address to output the shifted and latched addresses as first and second shift addresses based on a refresh command of a bank activated by the bank active signal.

According to another embodiment, a semiconductor device comprises an address input circuit and a target address generation circuit. The address input circuit latches a bank address and an address to generate a bank active signal and a latch address based on the execution of an active operation. The target address generation circuit generates and latches a target address from the latch address based on the bank active signal and a refresh command.

According to another embodiment, a semiconductor device comprises a refresh execution circuit. The refresh execution circuit executes a smart refresh operation based on the target address by executing a refresh operation of memory cells connected to at least one word line which is adjacent to a word line that is accessed by the target address.

According to another embodiment, a semiconductor device comprises an address input circuit and a target address generation circuit. The address input circuit latches a bank address and an address to generate a bank active signal and a latch address based on the execution of an active operation. The target address generation circuit generates the latch address as a target address based on a refresh command while the bank active signal is enabled.

DETAILED DESCRIPTION OF THE EMBODIMENTS

Various embodiments of the present disclosure will be described hereinafter with reference to the accompanying drawings.

However, the embodiments described herein are for illustrative purposes only and are not intended to limit the scope of the present disclosure.

Various embodiments may be directed to semiconductor devices executing a smart refresh operation.

Figure 1:
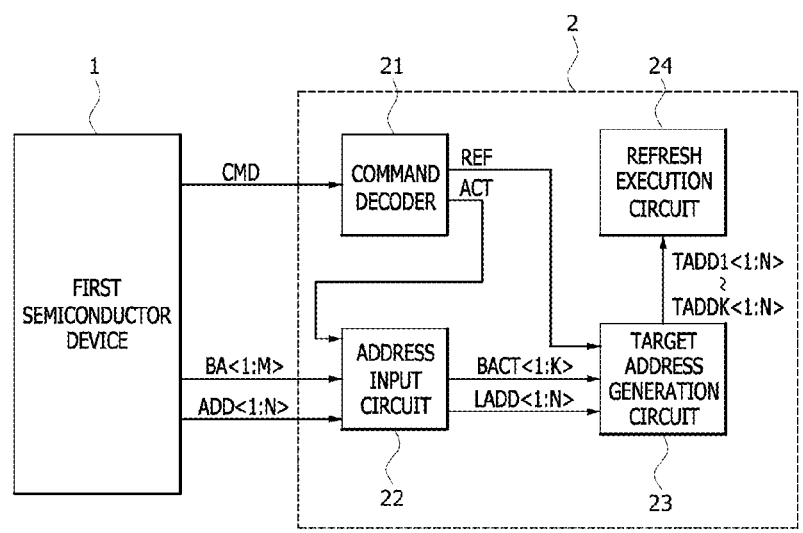
FIG. 1 is a block diagram illustrating a representation of an example of a configuration of a semiconductor system according to an embodiment.

Referring to FIG. 1, a semiconductor system according to an embodiment may include a first semiconductor device 1 and a second semiconductor device 2. The first semiconductor device 1 may apply an external command CMD, a bank address BA<1:M> and an address ADD<1:N> to the second semiconductor device 2. The external command CMD may correspond to a signal including a plurality of bits. The second semiconductor device 2 may include a command decoder 21, an address input circuit 22, a target address generation circuit 23 and a refresh execution circuit 24.

The command decoder 21 may decode the external command CMD to generate an active command ACT and a refresh command REF. The active command ACT may be enabled to execute an active operation, and the refresh command REF may be enabled to execute a refresh operation.

The address input circuit 22 may generate a bank active signal BACT<1:K> and a latch address LADD<1:N> from the bank address BA<1:M> and the address ADD<1:N> in response to the active command ACT. The address input circuit 22 may decode the bank address BA<1:M> to generate the bank active signal BACT<1:K> if the active command ACT enabled for execution of the active operation is inputted to the address input circuit 22. The address input circuit 22 may latch the address ADD<1:N> to generate the latch address LADD<1:N> if the active command ACT enabled for execution of the active operation is inputted to the address input circuit 22.

The target address generation circuit 23 may generate first to $K^{th}$ target addresses TADD1<1:N>~TADDK<1:N> from the bank active signal BACT<1:K> and the latch address LADD<1:N> in response to the refresh command REF. The target address generation circuit 23 may generate and latch the first to $K^{th}$ target addresses TADD1<1:N>~TADDK<1:N> from the latch address LADD<1:N> in response to the bank active signal BACT<1:K> and the refresh command REF. The target address generation circuit 23 may output the first to $K^{th}$ target addresses TADD1<1:N>~TADDK<1:N> which are latched.

The refresh execution circuit 24 may execute a smart refresh operation in response to the first to $K^{th}$ target addresses TADD1<1:N>~TADDK<1:N>. For example, the refresh execution circuit 24 may execute a refresh operation of memory cells connected to at least one word line which is adjacent to a word line that is accessed by each of the first to $K^{th}$ target addresses TADD1<1:N>~TADDK<1:N>.

Figure 2:
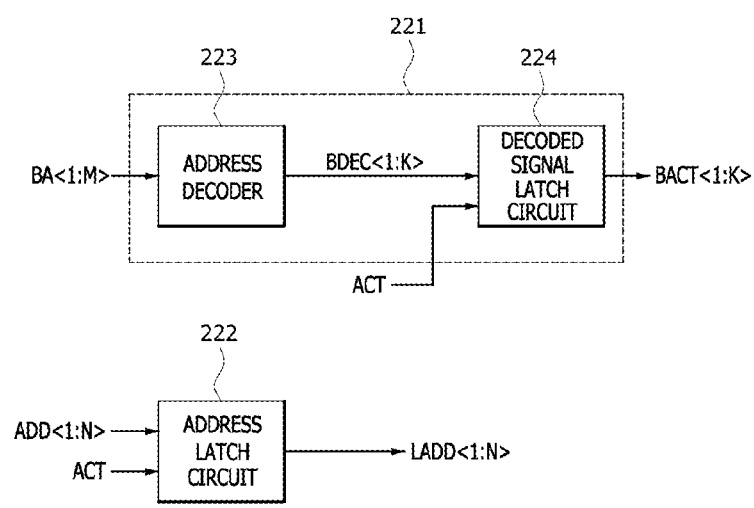
FIG. 2 is a block diagram illustrating a representation of an example of a configuration of an address input circuit included in the semiconductor system of FIG. 1.

Referring to FIG. 2, the address input circuit 22 may include a bank active signal generation circuit 221 and an address latch circuit 222. The bank active signal generation circuit 221 may include an address decoder 223 and a decoded signal latch circuit 224.

The address latch circuit 222 may generate the latch address LADD<1:N> from the address ADD<1:N> in response to the active command ACT. For example, the address latch circuit 222 may latch the address ADD<1:N> to output the latch address LADD<1:N> if the active command ACT is enabled to execute the active operation.

The address decoder 223 may decode the bank address BA<1:M> to generate a bank decoded signal BDEC<1:K>. Any one of bits included in the bank decoded signal BDEC<1:K> may be selectively enabled according to a logic level combination of bits included in the bank address BA<1:M>.

The decoded signal latch circuit 224 may generate the bank active signal BACT<1:K> from the bank decoded signal BDEC<1:K> in response to the active command ACT. For example, the decoded signal latch circuit 224 may latch the bank decoded signal BDEC<1:K> to output the latched signal as the bank active signal BACT<1:K> if the active command ACT is enabled to execute the active operation.

Figure 3:
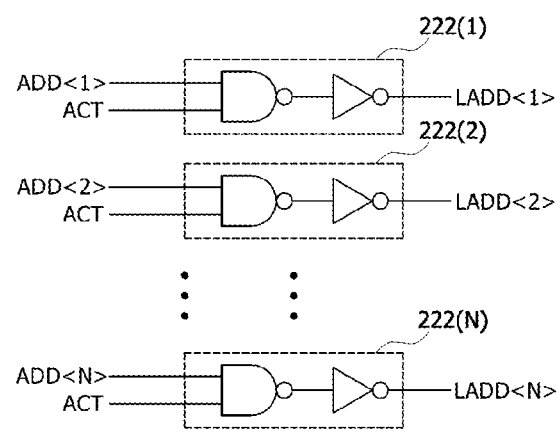
FIG. 3 is a circuit diagram illustrating a representation of an example of an address latch circuit included in the address input circuit of FIG. 2.

Referring to FIG. 3, the address latch circuit 222 may include first to $N^{th}$ logic circuits 222(1:N). The first logic circuit 222(1) may latch the address ADD<1> to output the latched signal as the latch address LADD<1> if the active command ACT is enabled to have a logic "high" level for execution of the active operation. The second logic circuit 222(2) may latch the address ADD<2> to output the latched signal as the latch address LADD<2> if the active command ACT is enabled to have a logic "high" level for execution of the active operation. The $N^{th}$ logic circuit 222(N) may latch the address ADD<N> to output the latched signal as the latch address LADD<N> if the active command ACT is enabled to have a logic "high" level for execution of the active operation.

Figure 4:
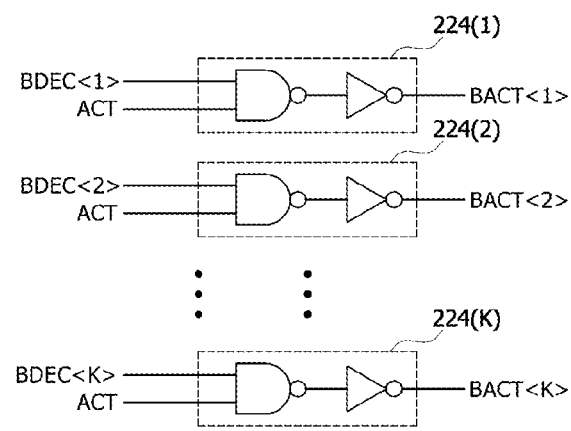
FIG. 4 is a circuit diagram illustrating a representation of an example of a decoded signal latch circuit included in the address input circuit of FIG. 2.

Referring to FIG. 4, the decoded signal latch circuit 224 may include first to $K^{th}$ bank logic circuits 224(1:K). The first bank logic circuit 224(1) may latch the bank decoded signal BDEC<1> to output the latched signal as the first bank active signal BACT<1> if the active command ACT is enabled to have a logic "high" level for execution of the active operation. The second bank logic circuit 224(2) may latch the bank decoded signal BDEC<2> to output the latched signal as the second bank active signal BACT<2> if the active command ACT is enabled to have a logic "high" level for execution of the active operation. The $K^{th}$ bank logic circuit 224(K) may latch the bank decoded signal BDEC<K> to output the latched signal as the $K^{th}$ bank active signal BACT<K> if the active command ACT is enabled to have a logic "high" level for execution of the active operation. The $K^{th}$ bank active signal BACT<K> may be enabled to execute an active operation of a $K^{th}$ bank (not illustrated) included in the second semiconductor device 2. The second semiconductor device 2 may include a plurality of banks, and each of the banks may be comprised of a plurality memory cells.

Figure 5:
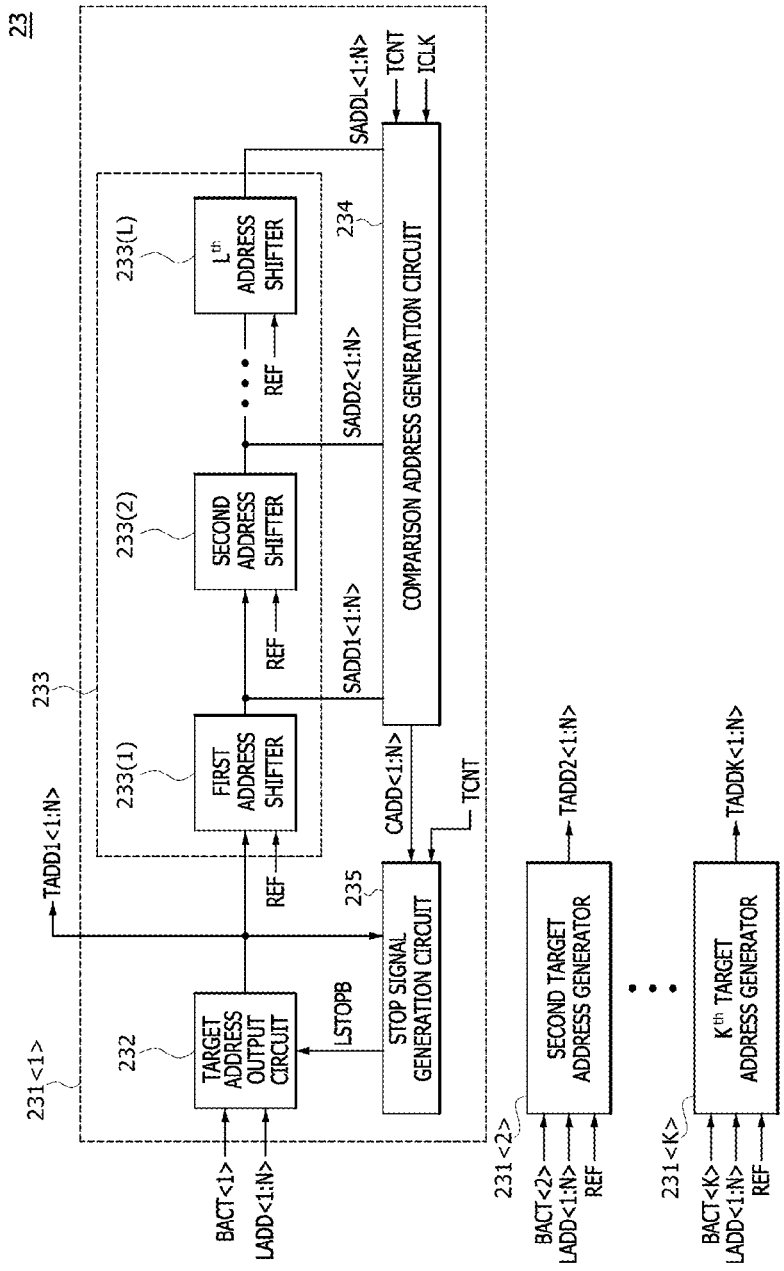
FIG. 5 is a block diagram illustrating a representation of an example of a configuration of a target address generation circuit included in the semiconductor system of FIG. 1.

Referring to FIG. 5, the target address generation circuit 23 may include first to $K^{th}$ target address generators 231<1:K>. The first target address generator 231<1> may generate and output the first target address TADD1<1:N> from the latch address LADD<1:N> in response to the refresh command REF while the first bank active signal BACT<1> is enabled. The second target address generator 231<2> may generate and output the second target address TADD2<1:N> from the latch address LADD<1:N> in response to the refresh command REF while the second bank active signal BACT<2> is enabled. The $K^{th}$ target address generator 231<K> may generate and output the $K^{th}$ target address TADDK<1:N> from the latch address LADD<1:N> in response to the refresh command REF while the $K^{th}$ bank active signal BACT<K> is enabled.

The first target address generator 231<1> may include a target address output circuit 232, an address shift circuit 233, a comparison address generation circuit 234 and a stop signal generation circuit 235.

The target address output circuit 232 may output the latch address LADD<1:N> as the first target address TADD1<1:N> in response to the first bank active signal BACT<1> and a stop signal LSTOPB. For example, the target address output circuit 232 may output the latch address LADD<1:N> as the first target address TADD1<1:N> while the first bank active signal BACT<1> is enabled and the stop signal LSTOPB is disabled.

The address shift circuit 233 may include first to $L^{th}$ address shifters 233(1:L). The first to $L^{th}$ address shifters 233(1:L) may sequentially shift and latch the first target address TADD1<1:N> to output the shifted and latched addresses as first to $L^{th}$ shift addresses SADD1<1:N>~SADDL<1:N>, in response to the refresh command REF. If a first enabled one of the refresh command REF is inputted to the address shift circuit 233, the first address shifter 233(1) may output the first target address TADD1<1:N> as the first shift address SADD1<1:N>. If a second enabled one of the refresh command REF is inputted to the address shift circuit 233, the first address shifter 233(1) may output the first target address TADD1<1:N> as the first shift address SADD1<1:N> and the second address shifter 233(2) may output the first shift address SADD1<1:N> generated in response to the first enabled one of the refresh command REF as the second shift address SADD2<1:N>. If an $L^{th}$ enabled one of the refresh command REF is inputted to the address shift circuit 233, the $L^{th}$ address shifter 233(L) may output a signal, which is sequentially shifted by the first to $(L-1)^{th}$ address shifters 233(1:(L-1)), as the $L^{th}$ shift address SADDL<1:N>.

The comparison address generation circuit 234 may output the first to $L^{th}$ shift addresses SADD1<1:N>~SADDL<1:N> as a comparison address CADD<1:N> in response to a transmission control signal TCNT and an internal clock ICLK. For example, the comparison address generation circuit 234 may sequentially output the first to $L^{th}$ shift addresses SADD1<1:N>~SADDL<1:N> as the comparison address CADD<1:N> in synchronization with the internal clock ICLK if the transmission control signal TCNT is enabled.

The stop signal generation circuit 235 may compare the comparison address CADD<1:N> with the first target address TADD1<1:N> to generate the stop signal LSTOPB. For example, the stop signal generation circuit 235 may generate the stop signal LSTOPB which is enabled if the comparison address CADD<1:N> is consistent with the first target address TADD1<1:N>. For example, the stop signal generation circuit 235 may generate the stop signal LSTOPB which is disabled if the comparison address CADD<1:N> is different from the first target address TADD1<1:N>.

The first target address generator 231<1> may generate the first target address TADD1<1:N> from the latch address LADD<1:N> to store the first target address TADD1<1:N> in the address shift circuit 233, whenever the enabled refresh command REF is inputted to the address shift circuit 233. As a result, L-number of the first target addresses TADD1<1:N> may be stored in the address shift circuit 233. The first target address generator 231<1> may terminate an operation for generating the first target address TADD1<1:N> from the latch address LADD<1:N> if the first target address TADD1<1:N> is consistent with an address stored in the address shift circuit 233.

The second target address generator 231<2> to kth target address generator 231<k> may have substantially the same configuration as the first target address generator 231<1> except input and output signals thereof. Accordingly, descriptions of the second target address generator 231<2> to kth target address generator 231<k> will be omitted hereinafter to avoid duplicate explanation.

Figure 6:
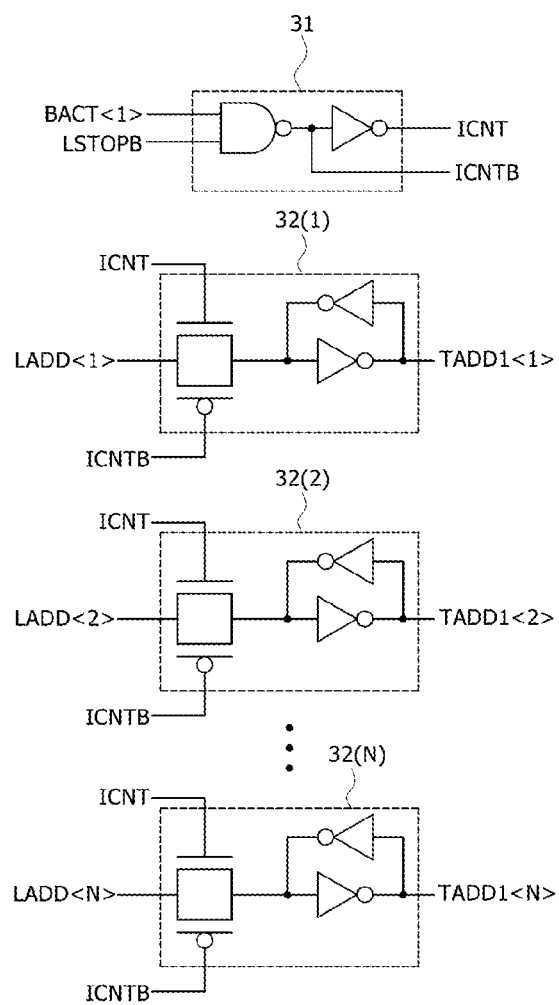
FIG. 6 is a circuit diagram illustrating a representation of an example of a target address output circuit included in the target address generation circuit of FIG. 5.

Referring to FIG. 6, the target address output circuit 232 may include a control signal generation circuit 31 and first to $N^{th}$ latch output circuits 32(1:N).

The control signal generation circuit 31 may generate an internal control signal ICNT and an inverted internal control signal ICNTB in response to the first bank active signal BACT<1> and the stop signal LSTOPB. For example, the control signal generation circuit 31 may generate the internal control signal ICNT disabled to have a logic "low" level and the inverted internal control signal ICNTB disabled to have a logic "high" level, if the stop signal LSTOPB is enabled to have a logic "low" level. The control signal generation circuit 31 may generate the internal control signal ICNT enabled to have a logic "high" level and the inverted internal control signal ICNTB enabled to have a logic "low" level, if the stop signal LSTOPB is disabled to have a logic "high" level and the first bank active signal BACT<1> is enabled to have a logic "high" level.

The first to $N^{th}$ latch output circuits 32(1:N) may buffer the latch address LADD<1:N> to output the buffered address as the first target address TADD1<1:N> in response to the internal control signal ICNT enabled to have a logic "high" level and the inverted internal control signal ICNTB enabled to have a logic "low" level. The first to $N^{th}$ latch output circuits 32(1:N) may terminate that the latch address LADD<1:N> and is outputted as the first target address TADD1<1:N>, in response to the internal control signal ICNT disabled to have a logic "low" level and the inverted internal control signal ICNTB disabled to have a logic "high" level.

Figure 7:
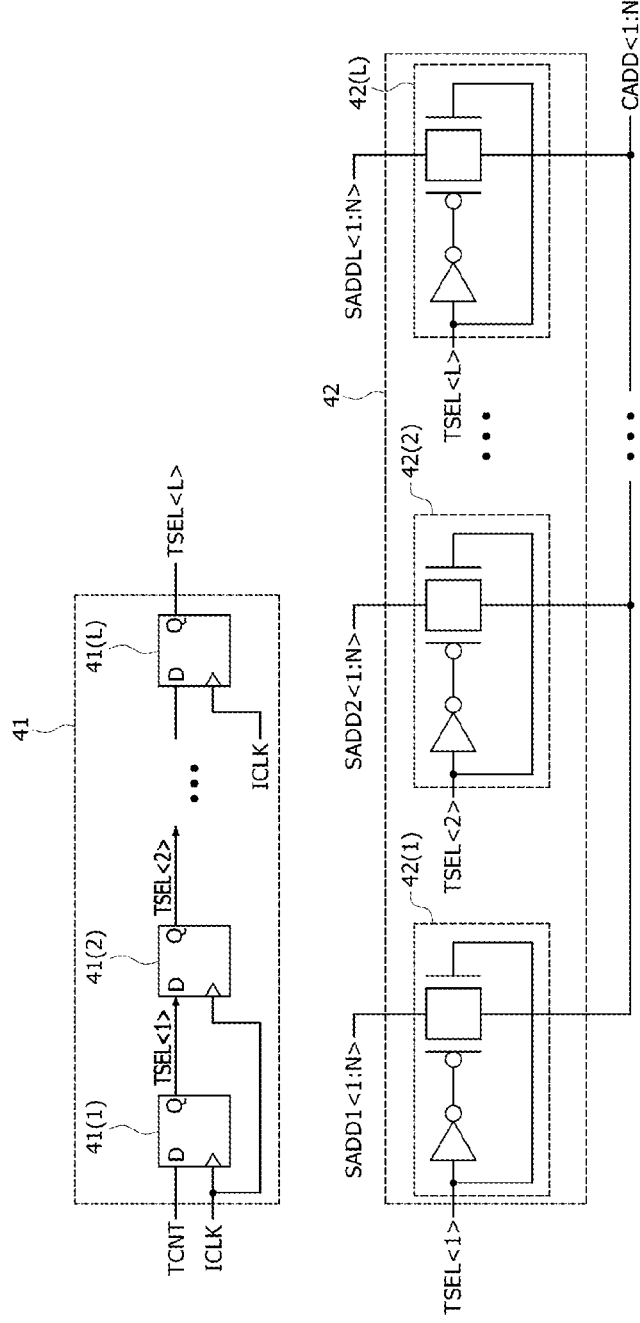
FIG. 7 is a circuit diagram illustrating a representation of an example of a comparison address generation circuit included in the target address generation circuit of FIG. 5.

Referring to FIG. 7, the comparison address generation circuit 234 may include a transmission selection signal generation circuit 41 and a comparison address output circuit 42.

The transmission selection signal generation circuit 41 may include first to $L^{th}$ transmission selection signal latches 41(1:L). The first to $L^{th}$ transmission selection signal latches 41(1:L) may sequentially shift the transmission control signal TCNT to generate first to $L^{th}$ transmission selection signals TSEL<1:L> in synchronization with the internal clock ICLK. The first to $L^{th}$ transmission selection signal latches 41(1:L) may be synchronized with the internal clock ICLK to generate the first to $L^{th}$ transmission selection signals TSEL<1:L> which are sequentially enabled to have a logic "high" level during one cycle time of the internal clock ICLK, if a pulse (having a logic "high" level) of the transmission control signal TCNT is inputted to the transmission selection signal generation circuit 41.

The comparison address output circuit 42 may include first to $L^{th}$ selection output circuits 42(1:L). The first selection output circuit 42(1) may output the first shift address SADD1<1:N> as the comparison address CADD<1:N> if the first transmission selection signal TSEL<1> is enabled to have a logic "high" level. The second selection output circuit 42(2) may output the second shift address SADD2<1:N> as the comparison address CADD<1:N> if the second transmission selection signal TSEL<2> is enabled to have a logic "high" level. The $L^{th}$ selection output circuit 42(L) may output the $L^{th}$ shift address SADDL<1:N> as the comparison address CADD<1:N> if the $L^{th}$ transmission selection signal TSEL<L> is enabled to have a logic "high" level.

An operation of the comparison address generation circuit 234 will be described hereinafter with reference to FIG. 8.

Figure 8:
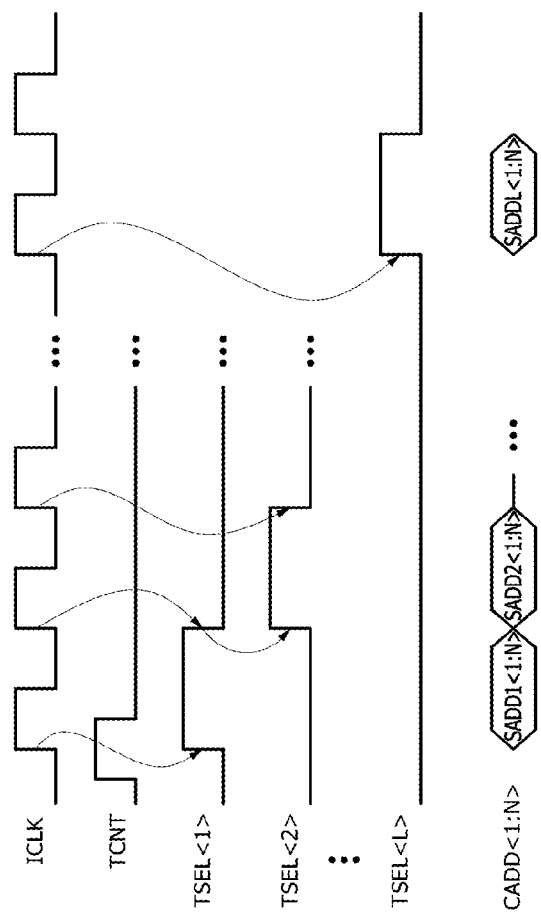
FIG. 8 is a timing diagram illustrating a representation of an example of an operation of the comparison address generation circuit shown in FIG. 7.

Referring to FIG. 8, if a pulse (having a logic "high" level) of the transmission control signal TCNT is inputted to the transmission selection signal generation circuit 41, the first to $L^{th}$ transmission selection signals TSEL<1:L> may be sequentially enabled to have a logic "high" level in synchronization with rising edges of the internal clock ICLK. While the first transmission selection signal TSEL<1> is enabled to have a logic "high" level, the first shift address SADD1<1:N> may be outputted as the comparison address CADD<1:N>. While the second transmission selection signal TSEL<2> is enabled to have a logic "high" level, the second shift address SADD2<1:N> may be outputted as the comparison address CADD<1:N>. While the $L^{th}$ transmission selection signal TSEL<L> is enabled to have a logic "high" level, the $L^{th}$ shift address SADDL<1:N> may be outputted as the comparison address CADD<1:N>.

Figure 9:
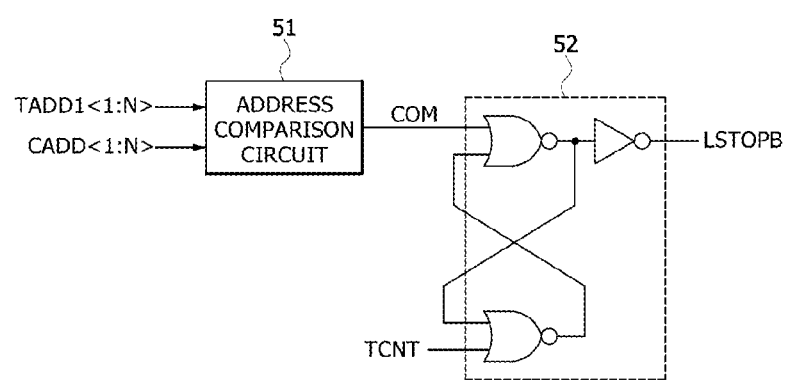
FIG. 9 is a block diagram illustrating a representation of an example of a stop signal generation circuit included in the target address generation circuit of FIG. 5.

Referring to FIG. 9, the stop signal generation circuit 235 may include an address comparison circuit 51 and a stop signal output circuit 52.

The address comparison circuit 51 may generate a comparison signal COM having a logic "low" level if the comparison address CADD<1:N> is consistent with the first target address TADD1<1:N>. The address comparison circuit 51 may generate the comparison signal COM having a logic "high" level if the comparison address CADD<1:N> is different from the first target address TADD1<1:N>.

The stop signal output circuit 52 may generate the stop signal LSTOPB which is enabled to have a logic "low" level if the comparison signal COM has a logic "low" level while the transmission control signal TCNT is enabled to have a logic "high" level.

The semiconductor system having an aforementioned configuration may generate all of the activated addresses as the target addresses and may execute a smart refresh operation of each of target word lines which are accessed by the target addresses. Thus, a semiconductor system according to an embodiment may prevent data of memory cells connected to word lines adjacent to the target word lines from being lost. In addition, a semiconductor system according to an embodiment may store the target addresses by which a refresh operation is executed and may terminate generation of the target addresses if addresses are consistent with the target addresses stored therein. As a result, a refresh speed may be improved.

The semiconductor system described with reference to FIG. 1 may be applied to an electronic system that includes a memory system, a graphic system, a computing system, a mobile system, or the like. For example, referring to FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor device 2 illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 10:
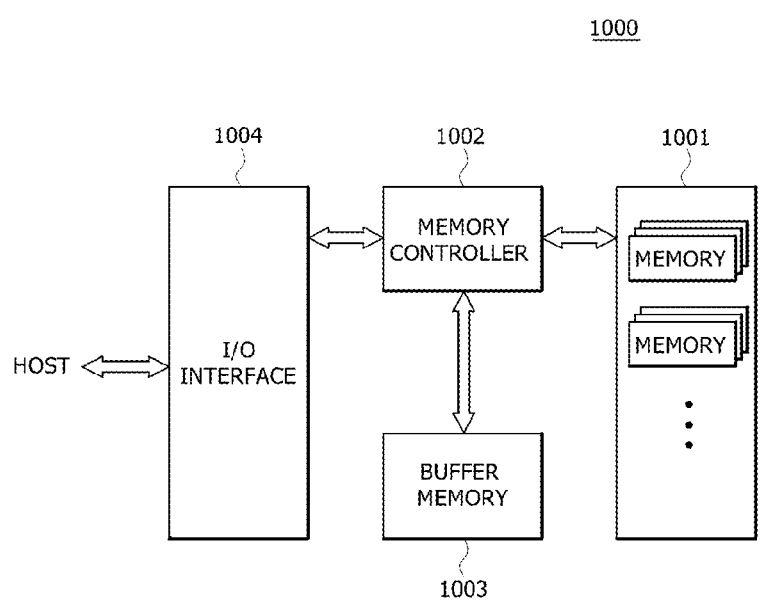
FIG. 10 is a block diagram illustrating a representation of an example of a configuration of an electronic system including the semiconductor system shown in FIG. 1.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory. The memory controller 1002 may include the first semiconductor device 1 illustrated in FIG. 1.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the embodiments described above, a refresh operation of word lines adjacent to all of target word lines activated may be executed to prevent data of memory cells connected to the word lines adjacent to the target word lines from being lost due to an interference effect between the target word lines and the word lines adjacent to the target word lines.

What is claimed is:

1. A semiconductor device comprising:
   an address input circuit configured to latch a bank address and an address to generate a bank active signal and a latch address based on the execution of an active operation; and
   a target address generation circuit configured to output the latch address as a target address whenever a refresh command of a bank activated by the bank active signal is enabled and configured to store the target address within the target address generation circuit,
   wherein the target address generation circuit includes a target address output circuit configured to output the latch address as the target address based on the bank active signal and a stop signal, and an address shift circuit configured to sequentially shift and latch the target address to output the shifted and latched addresses as first and second shift addresses based on the refresh command.

2. The semiconductor device of claim 1, wherein the address input circuit includes:
   an address latch circuit configured to latch the address to generate the latch address based on an active command; and
   a decoded signal latch circuit configured to latch a bank decoded signal generated by decoding the bank address to generate the bank active signal based on the active command.

3. The semiconductor device of claim 1, wherein the target address generation circuit is configured to include at least two address shifters that sequentially shift and latch the target address to output the latched target address in synchronization with the refresh command.

4. The semiconductor device of claim 3, wherein the target address generation circuit is configured to compare addresses stored in the at least two address shifters with the target address to control an operation whereby the latch address is outputted as the target address.

5. The semiconductor device of claim 1, wherein the stop signal is enabled if the target address is consistent with at least one of the first and second shift addresses.

6. The semiconductor device of claim 1, wherein the target address output circuit is configured to terminate outputting the latch address as the target address, if the stop signal is enabled.

7. The semiconductor device of claim 1, wherein the address shift circuit includes:
   a first address shifter configured to latch the target address to output the latched target address as the first shift address based on the refresh command; and
   a second address shifter configured to latch the first shift address to output the latched first shift address as the second shift address based on the refresh command.

8. The semiconductor device of claim 1, further comprising:
   a comparison address generation circuit configured to sequentially output the first and second shift addresses as a comparison address; and
   a stop signal generation circuit configured to compare the comparison address with the target address to generate the stop signal.

9. The semiconductor device of claim 8, wherein the comparison address generation circuit includes:
   a transmission selection signal generation circuit configured to sequentially shift a transmission control signal to generate first and second transmission selection signals based on an internal clock; and
   a comparison address output circuit configured to output the first and second shift addresses as the comparison address based on the first and second transmission selection signals.

10. The semiconductor device of claim 8, wherein the stop signal generation circuit includes:
    an address comparison circuit configured to compare the comparison address with the target address to generate a comparison signal; and
    a stop signal output circuit configured to generate the stop signal based on the comparison signal and a transmission control signal.

11. The semiconductor device of claim 1, further comprising:
    a refresh execution circuit configured to execute a smart refresh operation based on the target addresses by executing a refresh operation of memory cells connected to at least one word line which is adjacent to a word line that is accessed by each of the target addresses.

* * * * *